United States Patent
Kim et al.

(10) Patent No.: US 9,000,789 B2
(45) Date of Patent: Apr. 7, 2015

(54) METHOD AND EQUIPMENT FOR TESTING SEMICONDUCTOR APPARATUSES SIMULTANEOUSLY AND CONTINUOUSLY

(75) Inventors: Eun-sik Kim, Asan-si (KR); Kil-yeon Kim, Seongnam-si (KR); Yun-bo Yang, Asan-si (KR); Kui-hyun Ro, Asan-si (KR); Heon-gwon Lee, Suwon-si (KR); Young-jae Jung, Asan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 166 days.

(21) Appl. No.: 13/240,528

(22) Filed: Sep. 22, 2011

(65) Prior Publication Data
US 2012/0146673 A1    Jun. 14, 2012

(30) Foreign Application Priority Data

Dec. 13, 2010  (KR) ................ 10-2010-0127091

(51) Int. Cl.
*G01R 31/3187*    (2006.01)

(52) U.S. Cl.
CPC .................. *G01R 31/3187* (2013.01)

(58) Field of Classification Search
CPC .. G01R 31/31712–31/31717; G01R 31/31721; G01R 31/3187; G01R 31/31903–31/31915; G11C 29/16; G11C 29/48; G11C 2029/0401; G06F 11/27
USPC ............... 324/750.3, 750.05, 756.01, 756.02, 324/757.01, 757.02, 757.04, 757.05, 324/762.01–762.03, 762.05–762.06, 73.1; 438/14, 18; 714/718, 723, 724, 733, 714/734, 742

See application file for complete search history.

(56) References Cited

U.S. PATENT DOCUMENTS

| | | | |
|---|---|---|---|
| 5,130,646 A * | 7/1992 | Kojima | 324/73.1 |
| 5,453,992 A * | 9/1995 | Whetsel | 714/730 |
| 5,805,472 A * | 9/1998 | Fukasawa | 702/118 |
| 6,157,201 A * | 12/2000 | Leung, Jr. | 324/750.05 |
| 6,496,429 B2 * | 12/2002 | Murai et al. | 365/200 |

(Continued)

FOREIGN PATENT DOCUMENTS

| | | |
|---|---|---|
| JP | 11-148964 | 6/1999 |
| JP | 2003-004804 | 1/2003 |

(Continued)

OTHER PUBLICATIONS

Cheng, C. "Comprehensive Study on designing Memory BIST: Algorithms, implementations and Trade-offs." (Dec. 2002).*

*Primary Examiner* — Huy Q Phan
*Assistant Examiner* — James Split
(74) *Attorney, Agent, or Firm* — F. Chau & Associates, LLC

(57) ABSTRACT

A method for testing a plurality of semiconductor apparatuses, the method including mounting a plurality of semiconductor apparatuses on a first test board, wherein the plurality of semiconductor apparatuses include test circuits, loading test software into the test circuits, performing, by using the test circuits, self-tests on the plurality of semiconductor apparatuses based on the test software, and removing the plurality of semiconductor apparatuses, which have completed the self-tests, from the first test board. Upon completion of the loading of the test software, the test software is loaded into test circuits of a plurality of semiconductor apparatuses on a second test board, while the self-tests are performed on the plurality of semiconductor apparatuses on the first test board.

18 Claims, 10 Drawing Sheets

(56) References Cited

U.S. PATENT DOCUMENTS

| | | | |
|---|---|---|---|
| 6,708,319 B2 * | 3/2004 | Adachi et al. | 716/111 |
| 6,799,289 B2 * | 9/2004 | Totorica et al. | 714/718 |
| 6,978,411 B2 * | 12/2005 | Huang et al. | 714/733 |
| 7,422,914 B2 * | 9/2008 | Wada et al. | 438/14 |
| 7,543,200 B2 * | 6/2009 | Pramanick et al. | 714/724 |
| 7,580,807 B2 * | 8/2009 | Bullock et al. | 702/117 |
| 2004/0143411 A1 * | 7/2004 | Wu | 702/117 |
| 2004/0215569 A1 * | 10/2004 | Agha et al. | 705/57 |
| 2010/0052724 A1 * | 3/2010 | Mizuno | 324/765 |
| 2010/0205470 A1 * | 8/2010 | Moshayedi et al. | 713/340 |
| 2012/0117430 A1 * | 5/2012 | Yang et al. | 714/718 |

FOREIGN PATENT DOCUMENTS

| | | |
|---|---|---|
| JP | 2006-038791 | 2/2006 |
| JP | 2010-002315 | 1/2010 |

* cited by examiner

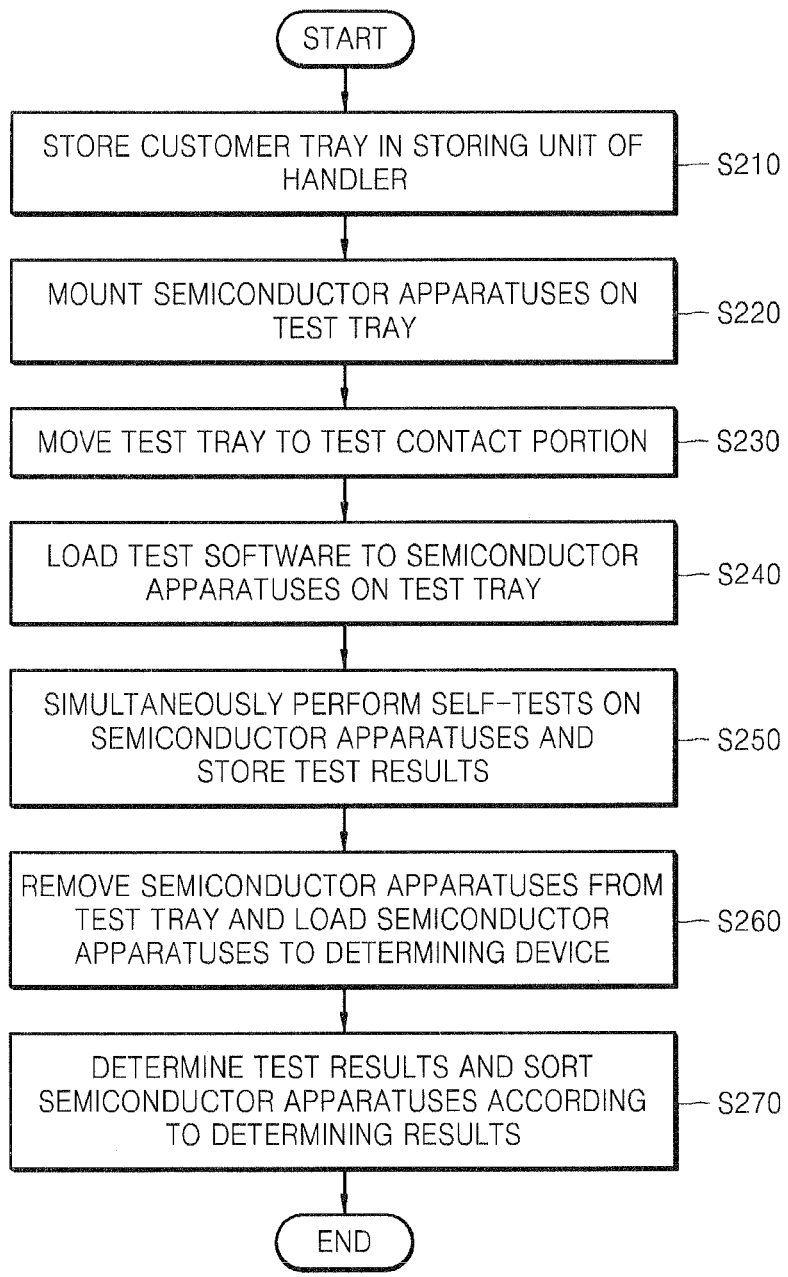

METHOD AND EQUIPMENT FOR TESTING SEMICONDUCTOR APPARATUSES SIMULTANEOUSLY AND CONTINUOUSLY

CROSS-REFERENCE TO RELATED APPLICATION

This application claims priority under 35 U.S.C. §119 to Korean Patent Application No. 10-2010-0127091, filed on Dec. 13, 2010, in the Korean Intellectual Property Office, the disclosure of which is incorporated by reference herein in its entirety.

BACKGROUND

1. Technical Field

The inventive concept relates to a method and equipment for testing a semiconductor apparatus, and more particularly, to a method and equipment for testing a plurality of semiconductor apparatuses simultaneously and continuously.

2. Discussion of the Related Art

In the manufacture of semiconductor apparatuses, tests are performed to ensure their proper functionality. A test process may include a wafer test and a final test, each of which identifies "passing" and "failing" devices. The wafer test is conducted on individual semiconductor chips at the wafer level prior to the packaging of the chips, for example. The final test is conducted on a packaged semiconductor apparatus, for example, a semiconductor product or a semiconductor solution product.

The final test may be divided into an electric feature test and a burn-in test. The electric feature test checks for normal operation and short-circuits by connecting all input/output terminals of a semiconductor apparatus to a test signal generating circuit, for example. The burn-in test exercises the chips of the packaged semiconductor apparatus to detect those that are defective by connecting some input/output terminals of the semiconductor apparatus to a test signal generating circuit and applying stress to the input/output terminals at a higher temperature, voltage, and/or current than those generally experienced in normal operating conditions, for example.

SUMMARY

The inventive concept provides a method and equipment for testing a plurality of semiconductor apparatuses simultaneously and continuously, so that in a final test, the number of semiconductor apparatuses that can be simultaneously tested is increased to reduce a test time per unit apparatus.

According to an exemplary embodiment of the inventive concept, there is provided a method of testing a plurality of semiconductor apparatuses. The method includes mounting a plurality of semiconductor apparatuses on a first test board, wherein the plurality of semiconductor apparatuses include test circuits, loading test software into the test circuits, performing, by using the test circuits, self-tests on the plurality of semiconductor apparatuses based on the test software, and removing the plurality of semiconductor apparatuses, which have completed the self-tests, from the first test board, wherein upon completion of the loading of the test software, the test software is loaded into test circuits of a plurality of semiconductor apparatuses on a second test board, while the self-tests are performed on the plurality of semiconductor apparatuses on the first test board.

The test circuits may be controllers provided in the plurality of semiconductor apparatuses on the first or second test boards, and the test software may be embedded in Firm Ware (F/W) of the controllers, and in the performing of the self-tests, the controllers may test the plurality of semiconductor apparatuses based on the test software.

The test circuits may be Built-In Self Test (BIST) circuits provided in the plurality of semiconductor apparatuses on the first or second test boards, and the test software may be loaded into the BIST circuits, and in the performing of the self-tests, the BIST circuits test the plurality of semiconductor apparatuses based on the test software.

The semiconductor apparatuses of the first or second test boards may include memories, and in the performing of the self-tests, the test circuits may test the memories and may store test results of the memories in the memories.

The test results may indicate whether the plurality of semiconductor apparatuses passed or failed their respective self-tests. If the test results are not stored in a memory, or the if the memory cannot be read, the semiconductor apparatus including the memory has failed its self-test.

A time for loading the test software to the test circuits of the plurality of semiconductor apparatuses on the first test board may be shorter than a time for performing the self-tests on the plurality of semiconductor apparatuses on the first test board, and a total time for the method may be equal to a time for performing the self-tests on the plurality of semiconductor apparatuses on the first test board+a time for loading the test software into the test circuits of the plurality of semiconductor apparatuses on the first test board×a number of test boards.

Power may be continuously supplied from a start of the self-tests on the plurality of semiconductor apparatuses on the first test board until completion of the self-tests on a plurality of semiconductor apparatuses on a last test board.

The method may use test equipment including a handler or test equipment including a chamber.

When the test equipment including the handler is used, the first and second test boards are first and second test trays, respectively, and the handler includes first and second test contact portions corresponding to the first and second test trays, such that the first and second test contact portions sequentially load the test software to the plurality of semiconductor apparatuses on the first and second test trays through first and second switches, respectively, or the handler includes a single test contact portion, such that when the first and second test trays are sequentially connected to the single test contact portion, the single test contact portion loads the test software to the plurality of semiconductor apparatuses on the test tray connected thereto.

When the test equipment including the chamber is used, the first and second test boards are first and second burn-in boards, respectively, and when the first and second burn-in boards are being sequentially mounted in a test room of the chamber, the test software is loaded into the first burn-in board through a first contact portion of the chamber, and then, into the second burn-in board through a second contact portion of the chamber, or after the first and second burn-in boards are mounted in the test room of the chamber, the test software is sequentially loaded through the first and second contact portions, respectively, of the chamber.

According to an exemplary embodiment of the inventive concept, there is provided a method of testing a plurality of semiconductor apparatuses. The method includes mounting a plurality of semiconductor apparatuses on a first test board of test equipment, wherein the plurality of semiconductor apparatuses include test circuits, loading test software to the test circuits, and performing, by using the test circuits, self-tests on the plurality of semiconductor apparatuses based on the test software, wherein a test contact portion of the test equipment loads the test software into the test circuits of the plurality of semiconductor apparatuses on the first test board, and then, loads the test software into test circuits of a plurality of semiconductor apparatuses on a second test board.

The test equipment may include a handler including a test tray, wherein the test tray may be the first or second test board, and a test contact portion which loads the test software to the test circuits of the plurality of semiconductor apparatuses on the test tray. The test equipment may include a burn-in chamber including first and second burn-in boards, wherein the first and second burn-in boards may be the first and second test boards, respectively, and a test room in which the first and second burn-in boards are disposed.

The equipment may further include a test device providing the test software to the handler or the burn-in chamber, a determining device reading results of the self-tests stored in memories of the plurality of semiconductor apparatuses on the first or second test boards to determine whether the plurality of semiconductor apparatuses passes or failed their respective self-tests and a sorting-storing unit sorting and storing the plurality of semiconductor apparatuses according to the pass or fail determination of the determining device.

According to an exemplary embodiment of the inventive concept, there is provided a method. The method including loading first test software into a plurality of semiconductor apparatuses disposed on a first test board; and loading second test software into a plurality of semiconductor apparatuses disposed on a second test board while the plurality of semiconductor apparatuses on the first test board are undergoing tests based on the first test software.

The plurality of semiconductor apparatuses on the first test board may be tested at the same time.

The first test software may be pre-stored in the plurality of semiconductor apparatuses on the first test board.

The first and second test software may be the same or different.

BRIEF DESCRIPTION OF THE DRAWINGS

The above and other features of the inventive concept will become more apparent by describing in detail exemplary embodiments thereof with reference to the accompanying drawings in which:

FIG. 6 is a flowchart illustrating a process of testing a plurality of semiconductor apparatuses simultaneously and continuously by using the test equipment illustrated in FIGS. 5A and 5B, according to an exemplary embodiment of the inventive concept;

DETAILED DESCRIPTION OF THE EMBODIMENTS

Figure 1:
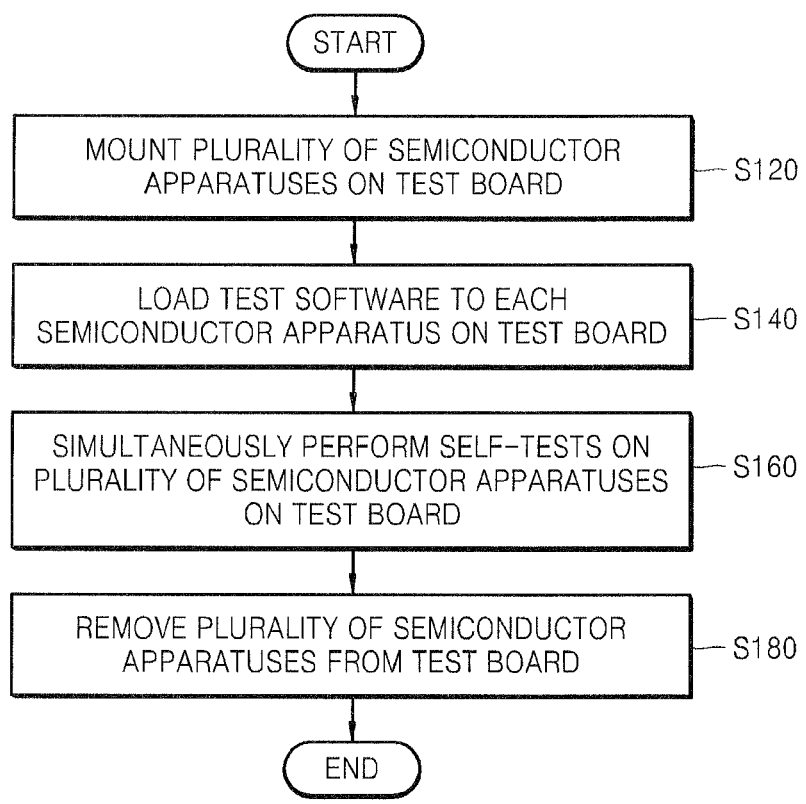
FIG. 1 is a flowchart illustrating a method of testing a plurality of semiconductor apparatuses simultaneously and continuously according to an exemplary embodiment of the inventive concept.

Hereinafter, exemplary embodiments of the inventive concept will be described in detail with reference to the accompanying drawings. The inventive concept may, however, be embodied in many different forms and should not be construed as being limited to the exemplary embodiments set forth herein. It will be understood that when a component is referred to as being "connected to" another component, it may be directly connected to the other component or intervening components may be present. In the drawings, the structure or size of each component may be exaggerated for convenience and clarity of illustration and portions unrelated to the component description may be omitted. Like reference numerals may indicate like elements throughout the drawings and specification.

FIG. 1 is a flowchart illustrating a method of testing a plurality of semiconductor apparatuses simultaneously and continuously according to an exemplary embodiment of the inventive concept.

Referring to FIG. 1, in the method of testing a plurality of semiconductor apparatuses simultaneously and continuously according to the current embodiment of the inventive concept, the plurality of semiconductor apparatuses are mounted on a test board in operation S120. Herein, the semiconductor apparatus may be any semiconductor product including an internal testing circuit. For example, the semiconductor apparatus may be a semiconductor solution product including an internal controller, such as a memory card or an embedded Multi Media Card (eMMC) memory with an MMC interface, flash memory and controller.

In the case of the semiconductor solution product, a controller may function as a test circuit. When the semiconductor apparatus has no controller, the semiconductor apparatus may include a Built-In Self Test (BIST) circuit for self-testing. Even when the semiconductor apparatus includes a controller, it may include a BIST circuit.

Once predetermined test software is loaded to the test circuit provided in the semiconductor apparatus, the test circuit may conduct a self-test on the semiconductor apparatus based on the test software. The test software may be any software suitable for testing the semiconductor apparatus. When the test circuit is a controller, the test software may be loaded using Firm Ware (F/W) of the controller.

The semiconductor apparatus may include, together with the test circuit, a semiconductor element as a test target, for example, a memory device such as a NAND flash memory or a Dynamic Random Access Memory (DRAM). Thus, the test circuit may self-test the performance of the memory device included in the semiconductor apparatus. The semiconductor apparatus according to the current embodiment is not limited to the memory device, and may include a non-memory device as a test target, such as a system with Large Scale Integration (LSI).

On the test board may be mounted a plurality of semiconductor apparatuses. For example, according to a type of the test board, 64 through 1024 semiconductor apparatuses may be mounted on the test board. However, the number of semiconductor apparatuses mounted on the test board is not limited to the foregoing range.

The test board may be structured similarly to a burn-in board used for chamber-type test equipment or a test tray used for handler-type test equipment. However, the test board according to the current embodiment is not limited to the structure of the test tray or the burn-in board. For example, the test board according to the current embodiment may be structured variously as long as it includes a function of loading test software to a plurality of mounted semiconductor apparatuses in a parallel manner.

For reference, the test tray is an apparatus, such as a shelf, on which the plurality of semiconductor apparatuses are placed on corresponding positions, and the burn-in board has a circuit disposed therein and the plurality of semiconductor apparatuses electrically contact the circuit. Due to a difference in structure, the test tray is connected with a test contact unit in which a circuit for electrically connecting the plurality of semiconductor apparatuses is disposed, and which includes pins contacting the semiconductor apparatuses. On the other hand, the burn-in board is connected with a test contact unit which contacts a terminal of the burn-in board.

After the semiconductor apparatuses are mounted on the test board, the test software is loaded into each of the semiconductor apparatuses mounted on the test board in operation S140. For example, the test software is loaded into the test circuit of each semiconductor apparatus. Test software loading may be performed to the plurality of semiconductor apparatuses mounted on the test board in a parallel and simultaneous manner.

When the plurality of semiconductor apparatuses are placed on the test board such as a test tray, a signal channel circuit may be connected to the plurality of semiconductor apparatuses in parallel to simultaneously load the test software to the plurality of semiconductor apparatuses. When a circuit for connecting the plurality of semiconductor apparatuses in parallel is provided in the test board such as a burn-in board, a signal channel may be connected to a terminal of the test board to load the test software to the plurality of semiconductor apparatuses at the same time.

Test software loading may continue on another test board upon completion of test software loading to a certain test board. In other words, independent of a to-be-later-described self-test based on the test software; test software loading is sequentially performed test board by test board.

After the test software is loaded, the test circuit in each semiconductor apparatus mounted on the test board self-tests the semiconductor apparatus based on the loaded test software in operation S160. As mentioned before, the semiconductor apparatus may include various circuit elements, such as a memory and a system with LSI, and the test circuit may test such circuit elements as test targets.

A test result obtained by the test circuit may be stored in a memory. For example, if the test target is a memory, the test circuit tests a state of the memory and stores the test result in the memory. The test result may be "pass" or "fail" and stored in the memory.

If the test target is a non-memory such as a system with LSI, the test result may be stored in a memory if the non-memory has a memory therein. If the non-memory has no memory therein, a memory may be disposed on the test board and the test result may be stored in the memory disposed on the test board. The memory disposed on the test board may be electrically connected to the test circuit of each semiconductor apparatus.

After the test software is loaded to the plurality of semiconductor apparatuses mounted on a certain (e.g., first) test board, the plurality of semiconductor apparatuses perform self-tests while test software loading may be performed on another (e.g., second) test board upon completion of loading the test software to the first test board, independent of the self-tests being performed on the plurality of semiconductor apparatuses on the first test board.

Upon completion of the self-tests performed by the plurality of semiconductor apparatuses mounted on the test board, the plurality of semiconductor apparatuses are removed from the test board in operation S180. The removal means physically separating the semiconductor apparatuses from the test board. After removal of the semiconductor apparatuses, other operations may be further performed, which will be described later with reference to FIGS. 5A through 8.

The method of testing a plurality of semiconductor apparatuses simultaneously and continuously according to the current embodiment may load the test software to the plurality of semiconductor apparatuses mounted on the test board in parallel and, after the loading of the test software, the plurality of semiconductor apparatuses may be self-tested at the same time. This may be accomplished by loading the test software to the test circuits, such as controllers, provided in the semiconductor apparatuses and self-testing the semiconductor apparatuses through the test circuits. In addition, by sequentially loading the test software to a plurality of test boards, a plurality of semiconductor apparatuses on, for example, a first test board may be self-tested at the same time as a plurality of semiconductor apparatuses on a second test board. In other words, in view of a test board, a plurality of semiconductor apparatuses on the test board are simultaneously self-tested, and in view of a plurality of test boards, a plurality of semiconductor apparatuses on first and second test boards can be simultaneously tested during an interval beginning after test software is loaded to the second (e.g., next in sequence) test board. As such, by testing a plurality of semiconductor apparatuses simultaneously and continuously, a test time per unit semiconductor apparatus can be reduced by a large amount.

Figure 2A:
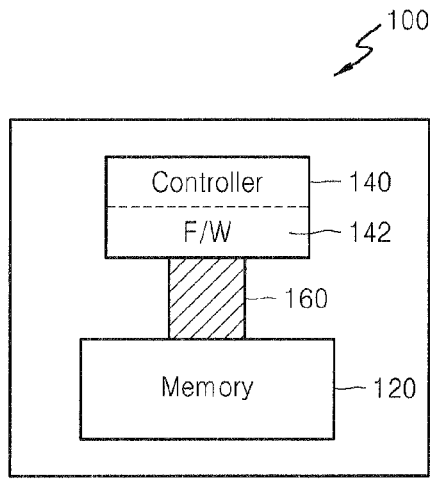
FIGS. 2A and 2B are block diagrams illustrating semiconductor apparatuses that can be tested by the test method illustrated in FIG. 1.
Figure 2B:
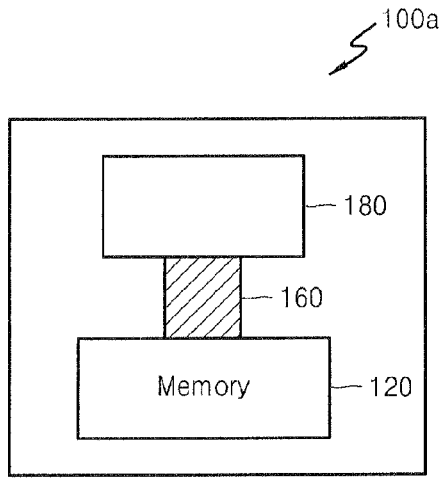

FIGS. 2A and 2B are block diagrams illustrating semiconductor apparatuses which can be tested by the test method illustrated in FIG. 1.

Referring to FIG. 2A, a semiconductor apparatus 100 which can be tested by the test method according to the current embodiment may include a memory 120 and a controller 140. The memory 120 may be various memory devices such as a NAND flash memory or a DRAM.

The controller 140 is connected to the memory 120 through an interconnector 160 to control data input to and data output from the memory 120. In the current embodiment, the controller 140 may function as a test circuit. Thus, the test software is loaded into F/W 142 of the controller 140 and the controller 140 tests a state of the memory 120 based on the test software loaded into the F/W 142.

Upon completion of the test by the controller 140, the test result may be stored in the memory 120. Thus, by reading the test result stored in the memory 120 later, "pass" or "fail" of the semiconductor apparatus 100 can be determined. If the test result is not stored because the memory 120 is defective, or if the test result cannot be read later even if the test result has been stored in the memory 120, the semiconductor apparatus 100 may be determined as "fail".

Referring to FIG. 2B, a semiconductor apparatus 100*a* which can be tested by the test method according to the current embodiment may include the memory 120 and a BIST circuit 180 which may be connected to the memory 120 through the interconnector 160.

In the current embodiment, instead of a controller, the BIST circuit 180 for testing is provided. Thus, the test software is loaded to the BIST circuit 180 which then tests the memory 120 based on the loaded test software. Like the controller 140, the BIST circuit 180 may also store the test result in the memory 120.

While the semiconductor apparatuses 100 and 100*a* include the controller 140 or the BIST circuit 180 in FIGS. 2A and 2B, the semiconductor apparatus according to the current embodiment may include any type of test circuit capable of performing a test. For example, the semiconductor apparatus may include both the controller 140 and the BIST circuit 180 at the same time. In FIGS. 2A and 2B, the memory 120 is used as an example of a test target, but a non-memory may also be a test target.

Figure 3:
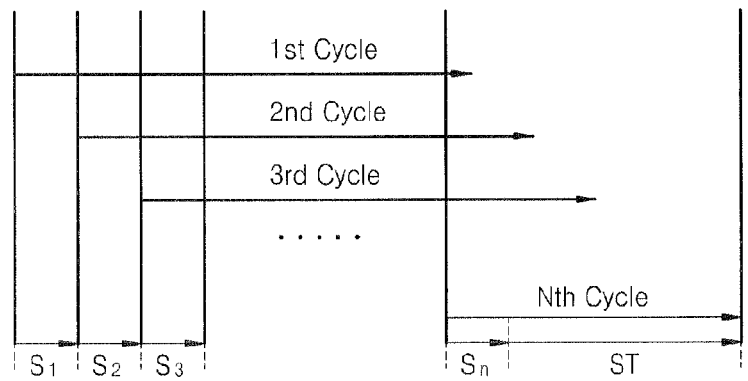
FIG. 3 is a diagram illustrating a principle of the test method illustrated in FIG. 1.

FIG. 3 is a diagram illustrating a principle of the test method illustrated in FIG. 1.

Referring to FIG. 3, the test method according to the current embodiment may test a plurality of semiconductor apparatuses simultaneously and continuously as shown.

In other words, let a time for testing a plurality of semiconductor apparatuses on each test board be 1 cycle, then test software is loaded during a first software loading time $S_1$ for a plurality of semiconductor apparatuses on a first test board and, after completion of test software loading, the plurality of semiconductor apparatuses on the first test board are self-tested simultaneously.

Test software loading for a plurality of semiconductor apparatuses on a second test board starts during a second software loading time $S_2$ immediately after the first software loading time $S_1$. After completion of that test software loading, the plurality of semiconductor apparatuses on the second test board are self-tested simultaneously.

In this way, test software loading is sequentially performed for a plurality of test boards, and may be performed independently of self-tests performed on a plurality of semiconductor apparatuses on each test board.

Test software loading for a plurality of semiconductor apparatuses on an $N^{th}$ test board, the last test board, is performed during an $N^{th}$ software loading time $S_n$, and after completion of that test software loading, the plurality of semiconductor apparatuses on the $N^{th}$ test board are self-tested simultaneously. Upon completion of the self-tests of the plurality of semiconductor apparatuses on the $N^{th}$ test board, the test process for the entire semiconductor apparatuses is terminated. Herein, ST refers to a self-test time.

If the number of semiconductor apparatuses mounted on each test board is uniform and the semiconductor apparatuses are the same as one another, each test software loading time $S_1, S_2, \ldots,$ and $S_n$, are equal to one another, and each the self-test time ST on first, second, . . . , and $N^{th}$ test boards are equal to one another. Thus, a total test time Tt may be expressed as follows:

$$Tt = 1 \text{ Cycle Time} + (N-1) \times \text{Test Software Loading Time} \tag{1}$$

The 1 cycle time is equal to test software loading time+ self-test time ST, such that Equation (1) may be expressed as follows:

$$Tt = ST + N \times \text{Test Software Loading Time} \tag{2}$$

If a total number of semiconductor apparatuses to be tested is M, a test time Te per one semiconductor apparatus may be expressed as follows:

$$Te = Tt/M \tag{3}$$

When a semiconductor apparatuses is conventionally tested without introducing a self-test as explained above, after completion of the tests for a plurality of semiconductor apparatuses on a test board, a plurality of semiconductor apparatuses on a next test board are tested. Such a conventional test method and the test method according to an exemplary embodiment of the inventive concept will be compared below.

For example, assume that 1000 semiconductor apparatuses are mounted on each test board, 10 test boards are tested, and a test time per test board is 10 minutes. Herein, the test time of 10 minutes may be understood as a total test time for a test board in a conventional test method and as a sum of a test software loading time, e.g. 1 minute, and a self-test time, e.g. 9 minutes, in the test method according to an exemplary embodiment of the inventive concept.

In the conventional test method, a test time per one semiconductor apparatus is (10 minutes×10)/10000=0.6 second.

On the other hand, in the test method according to an exemplary embodiment of the inventive concept, the test time per one semiconductor apparatus is (9 minutes+10×1 minute)/10000=0.114 second based on Equation (3). Therefore, it can be seen that the test time of the test method according to an exemplary embodiment of the inventive concept is shorter than the conventional test method by approximately ⅕.₃ time.

Figure 4:
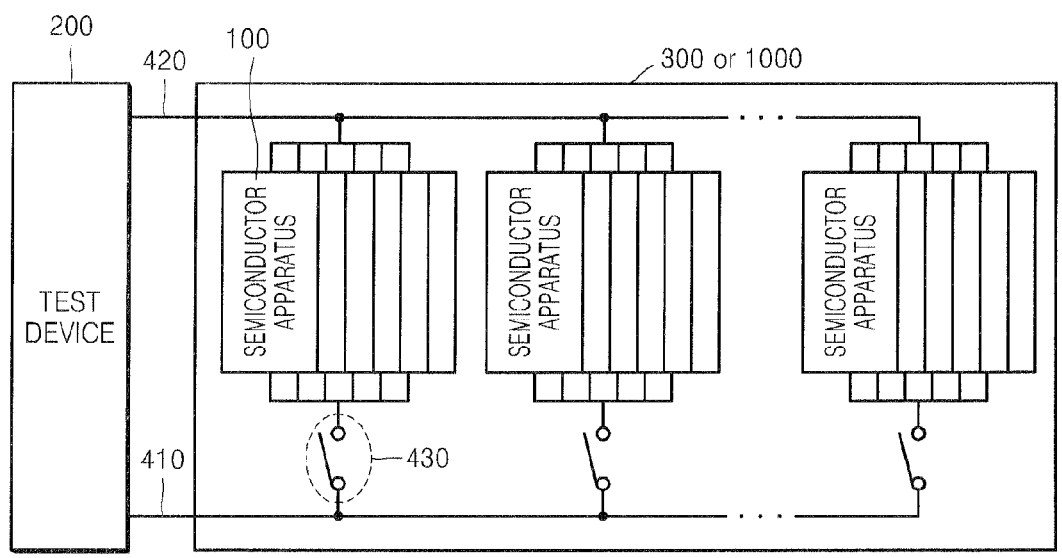
FIG. 4 is a block diagram illustrating equipment for testing a plurality of semiconductor apparatuses simultaneously and continuously according to an exemplary embodiment of the inventive concept.

FIG. 4 is a block diagram illustrating equipment for testing a plurality of semiconductor apparatuses simultaneously and continuously according to an exemplary embodiment of the inventive concept.

Referring to FIG. 4, the test equipment according to the current embodiment includes a test device 200 and a handler 300 or a chamber 1000.

The test device 200 delivers power and a signal to each semiconductor apparatus in the handler 300 or the chamber 1000. The delivered signal may be the above-described test software. The test device 200, which is a host, may be a Personal Computer (PC) or a workstation which stores the test software.

In the handler 300 or the chamber 1000 may be placed a plurality of test boards (not shown) on which a plurality of semiconductor apparatuses 100 may be mounted. The plurality of semiconductor apparatuses 100 mounted on each test board may be connected in parallel with one another in terms of circuit configuration. The test boards are also arranged in parallel and may be connected to a signal line 410 of the test device 200 through switches 430.

The test equipment structured as described above continuously supplies power to all of the semiconductor apparatuses 100 through a power line 420 from start of a test until completion of the test. As to a signal channel, any one of the test boards is connectable to the signal line 410 through a corresponding one of the switches 430 such that test software is loaded to the plurality of semiconductor apparatuses 100 on a connected test board at the same time, and after completion of test software loading, the switch 430 of the connected test board is opened, and a next test board is connected to the signal line 410 through its corresponding switch 430 such that the test software is loaded to a plurality of semiconductor apparatuses on that test board. In this way, test software loading to a plurality of semiconductor apparatuses on each test board is sequentially performed through a switch, such that the plurality of semiconductor apparatuses on each test board may conduct self-tests upon completion of test software loading, independent of the sequential test software loading.

Figure 5A:
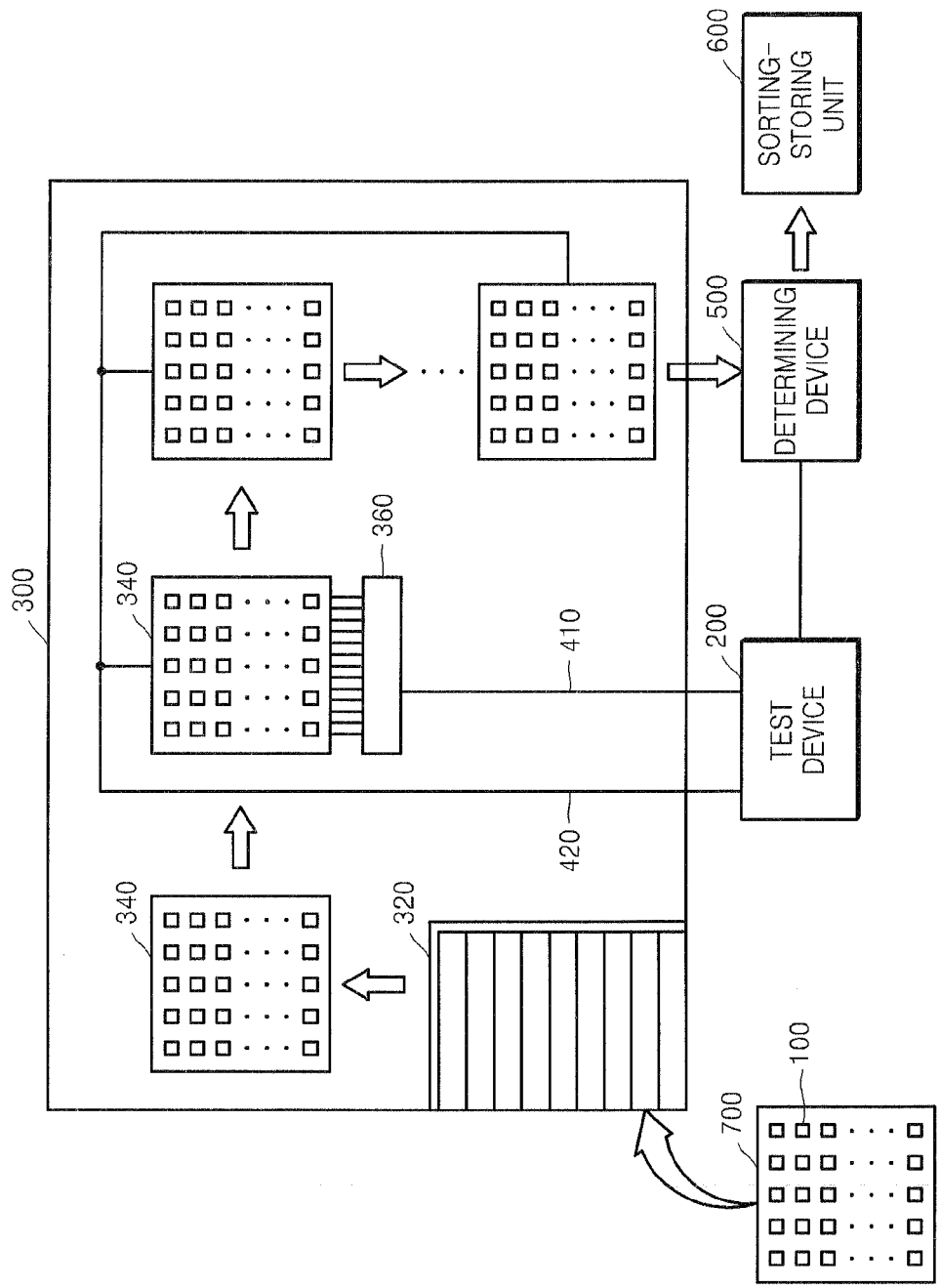
FIGS. 5A and 5B are block diagrams illustrating handler versions of the test equipment illustrated in FIG. 4, according to exemplary embodiments of the inventive concept.
Figure 5B:
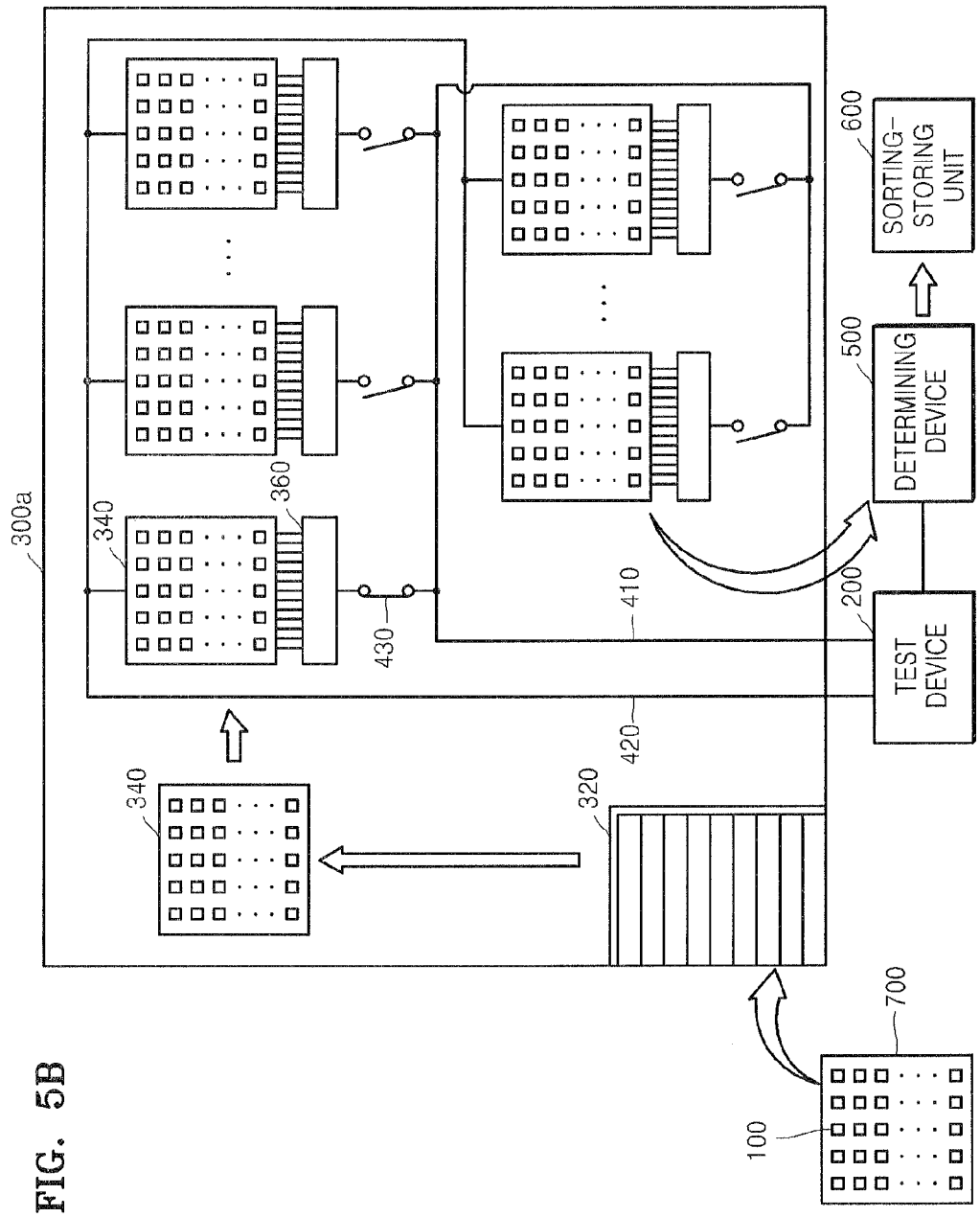

FIGS. 5A and 5B are block diagrams illustrating handler versions of the test equipment illustrated in FIG. 4, according to exemplary embodiments of the inventive concept.

Referring to FIG. 5A, a handler-type test equipment according to the current embodiment may include the test device 200, the handler 300, a determining device 500, and a sorting-storing unit 600. Herein, reference numeral 410 refers to the signal line and reference numeral 420 refers to the power line.

As mentioned above, the test device 200 may deliver power and a test software signal to each semiconductor apparatus 100 in the handler 300. The test device 200 may also be connected to the determining device 500, such that the determining device 500 determines "pass" or "fail" of the semiconductor apparatus 100 according to the test result.

The handler 300 may include a storing unit 320, a test tray 340, and a test contact portion 360. The storing unit 320 stores a customer tray 700 on which the plurality of semiconductor apparatuses 100 are mounted. The plurality of semiconductor apparatuses 100 mounted on the customer tray 700 stored in the storing unit 320 are then mounted on the test tray 340 to be moved to the test contact portion 360. The test tray 340 may have an internal circuit such that the semiconductor apparatuses 100 may be connected in parallel with one another in terms of circuit configuration or have a structure on which the semiconductor apparatuses 100 may be simply arranged. Even when the test tray 340 is structured to have the simple arrangement of the semiconductor apparatuses 100, a circuit for continuously supplying power to the test tray 340 may be included the test tray 340.

The test contact portion 360 receives test software from the test device 200 and loads the test software to each semiconductor apparatus 100 in the test tray 340. When the test tray 340 has an internal circuit and is structured to have the parallel connection of the semiconductor apparatuses 100, the test contact portion 360 may have input/output terminals, and by connecting the input/output terminals of the test contact portion 360 with input/output terminals of the test tray 340 with each other, the test software signal is applied to each semiconductor apparatus 100, thus performing test software loading.

When the test tray 340 has no internal circuit, the test contact portion 360 may be connected to each semiconductor apparatus 100 on the test tray 340 and may have a plurality of output pins which are parallel to one another. The test contact portion 360 receives the test software signal from the test device 200 through the input terminal thereof and applies the test software signal to each semiconductor apparatus 100 through the plurality of output pins thereof, thereby performing test software loading.

The test tray 340 which has completed test software loading is separated from the test contact portion 360, and in the separated test tray 340, the plurality of semiconductor apparatuses 100 perform self-tests based on the loaded test software. The self-test is conducted by a test circuit provided in each semiconductor apparatus 100 based on the loaded test software, and the test result may be stored in a memory of each semiconductor apparatus 100. The semiconductor apparatuses which have finished the self-tests are removed from the test tray 340 and then are transferred to the determining device 500.

The determining device 500 reads the memory of each semiconductor apparatus 100, in other words, reads out the test result from the memory to determine "pass" or "fail" of the semiconductor apparatus 100 based on the test result. The determining device 500 may determine the semiconductor apparatus 100 in whose memory any test result is not stored or whose memory cannot be read as "fail".

The sorting-storing unit 600 sorts the semiconductor apparatuses into "pass" semiconductor apparatuses and "fail" semiconductor apparatuses according to the determination of the determining device 500 and separately stores the "pass" semiconductor apparatuses and the "fail" semiconductor apparatuses. Thus, the sorting-storing unit 600 may include a pass-product storing unit (not shown) for storing a pass-semiconductor apparatus and a fail-product storing unit (not shown) for storing a fail-semiconductor apparatus.

The test equipment illustrated in FIG. 5B is similar to the test equipment illustrated in FIG. 5A except for the test contact portions 360 of a handler 300a. Hereinafter, like components will not be repetitively described for convenience' sake.

Referring to FIG. 5B, the test equipment according to the current embodiment may include a plurality of test contact portions 360 in the handler 300a. The plurality of test contact portions 360 may be connected to the signal line 410 through the switches 430. The test equipment structured in this way may perform sequentially test software loading to the test trays 340 through the switches 430.

In other words, in the test equipment illustrated in FIG. 5A, after completion of test software loading, the corresponding test tray 340 is separated from the test contact portion 360 and then the next test tray 340 is connected to the test contact portion 360 for test software loading. However, in the test equipment illustrated in FIG. 5B according to the current embodiment, a plurality of the test trays 340 are connected to the corresponding test contact portions 360, and the signal line 410 is connected to one of the test trays 340, at-a-time, through the switch 430 for test software loading. Thus, after completion of test software loading to the one connected test tray 340, the switch 430 is opened and the signal line 410 is connected to the next test tray 340 through the switch 430 for test software loading.

FIG. 6 is a flowchart illustrating a process of testing the plurality of semiconductor apparatuses 100 simultaneously and continuously by using the test equipment illustrated in FIGS. 5A and 5B, according to an exemplary embodiment of the inventive concept. To facilitate understanding, reference will be made also to FIG. 5A or FIG. 5B.

Referring to FIG. 6, the customer tray 700 is stored in the storing unit 320 of the handler 300 or 300a in operation S210. In operation S220, the plurality of semiconductor apparatuses 100 are mounted on the test tray 340. The test tray 340 is moved to the test contact portion 360 to be connected to the test contact portion 360 in operation S230. Herein, the connection means connecting the plurality of semiconductor apparatuses 100 on the test tray 340 to the output terminal of the test contact portion 360 in terms of circuit configuration. The connection to the test contact portion 360 may include both a connection to a single test contact portion 360 as shown in FIG. 5A and a connection to a plurality of test contact portions 360 as shown in FIG. 5B.

Next, test software is loaded into the plurality of semiconductor apparatuses 100 mounted on the test tray 340 in operation S240. Test software loading may include both sequential connection to the test contact portion 360 as shown in FIG. 5A and sequential loading through the switches 430 as shown in FIG. 5B. As already described, the test software is delivered from the test device 200 and is loaded to each semiconductor apparatus 100 on the test tray 340 through the test contact portion 360.

Upon completion of test software loading, the plurality of semiconductor apparatuses 100 on the test tray 340 perform self-tests at the same time and the test results are stored in memories of the semiconductor apparatuses 100, respectively, in operation S250. Independent of the self-tests, test software loading may take place on the next test tray 340 in a sequential manner.

Upon completion of the self-tests of the semiconductor apparatuses 100 on the test tray 340, the semiconductor apparatuses 100 are removed from the test tray 340 and are then loaded to the determining device 500 in operation S260. The determining device 500 determines "pass" or "fail" for the respective semiconductor apparatuses 100 based on the test results stored in the memories of the semiconductor apparatuses 100, and the sorting-storing unit 600 sorts and stores the semiconductor apparatuses 100 based on the determination results in operation 5270.

Figure 7A:
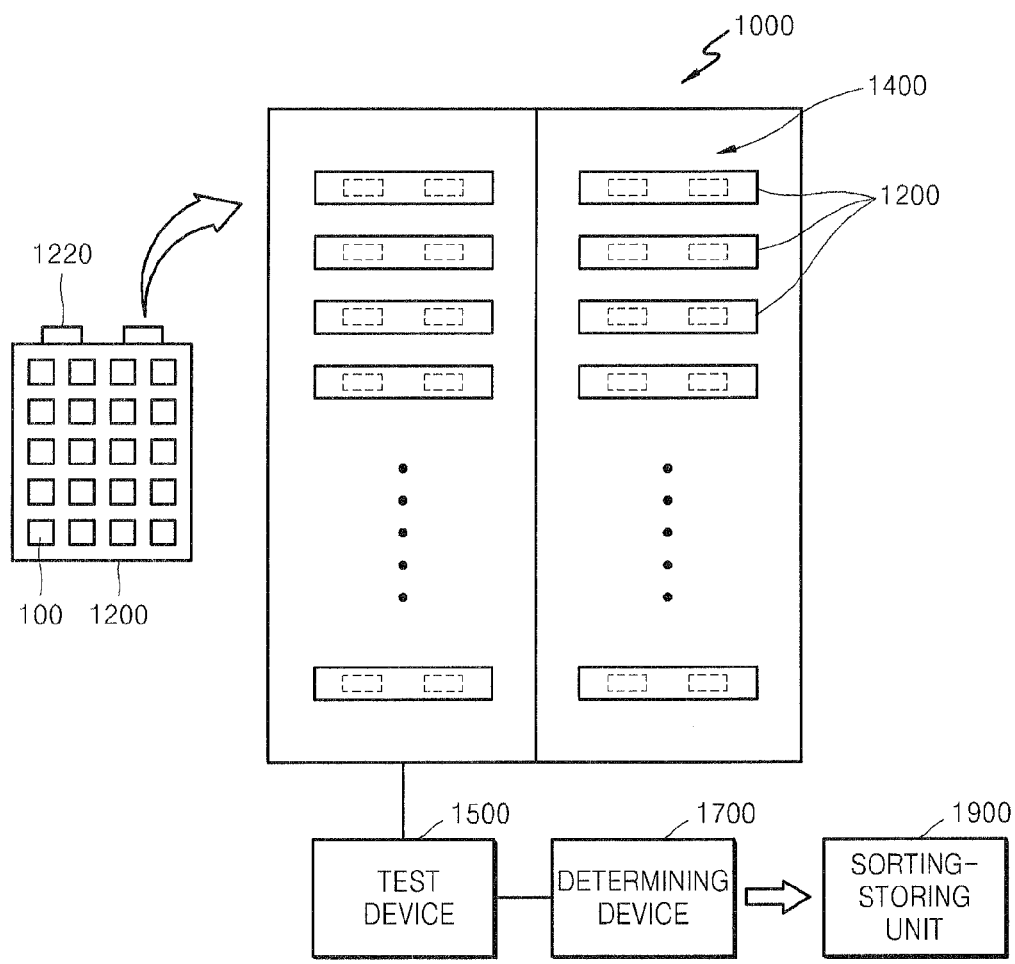
FIG. 7A is a block diagram of a chamber version of the test equipment illustrated in FIG. 4, according to an exemplary embodiment of the inventive concept.

FIG. 7A is a block diagram of a chamber version of the test equipment illustrated in FIG. 4, according to an exemplary embodiment of the inventive concept.

Referring to FIG. 7A, a chamber-type test equipment according to the current embodiment may include a burn-in board 1200, the chamber 1000, a test device 1500, a determining device 1700, and a sorting-storing unit 1900. On the burn-in board 1200 may be mounted the plurality of semiconductor apparatuses 100. For example, 512 semiconductor apparatuses 100 may be mounted on the burn-in board 1200. However, the number of mounted semiconductor apparatuses is not limited to this example.

The burn-in board 1200 is a test board generally used for a burn-in test, and may include an internal circuit for connecting the semiconductor apparatuses 100 in parallel and have input/output terminals 1220 at an edge thereof.

The chamber 1000 includes a test room 1400 in which the plurality of burn-in boards 1200 may be mounted. For example, 48 burn-in boards 1200 may be disposed in the test room 1400. However, the number of burn-in boards that can be disposed in the test room 1400 is not limited to this example. The test room 1400 may have a plurality of test contact portions (not shown) therein, which may be connected to the burn-in boards 1200, respectively, to apply a test software signal to the plurality of semiconductor apparatuses 100 on the burn-in boards 1200.

Test software loading may be performed as the burn-in boards 1200 are sequentially connected to the test contact portion of the test room 1400, or may be sequentially performed through switches (not shown) after all the burn-in boards 1200 to be tested are connected to corresponding test contact portions.

The test device 1500, the determining device 1700, and the sorting-storing unit 1900 function in substantially the same manner as the test device 200, the determining device 500, and the sorting-storing unit 600 illustrated in FIG. 5A or FIG. 5B, and thus will not be described again.

Figure 7B:
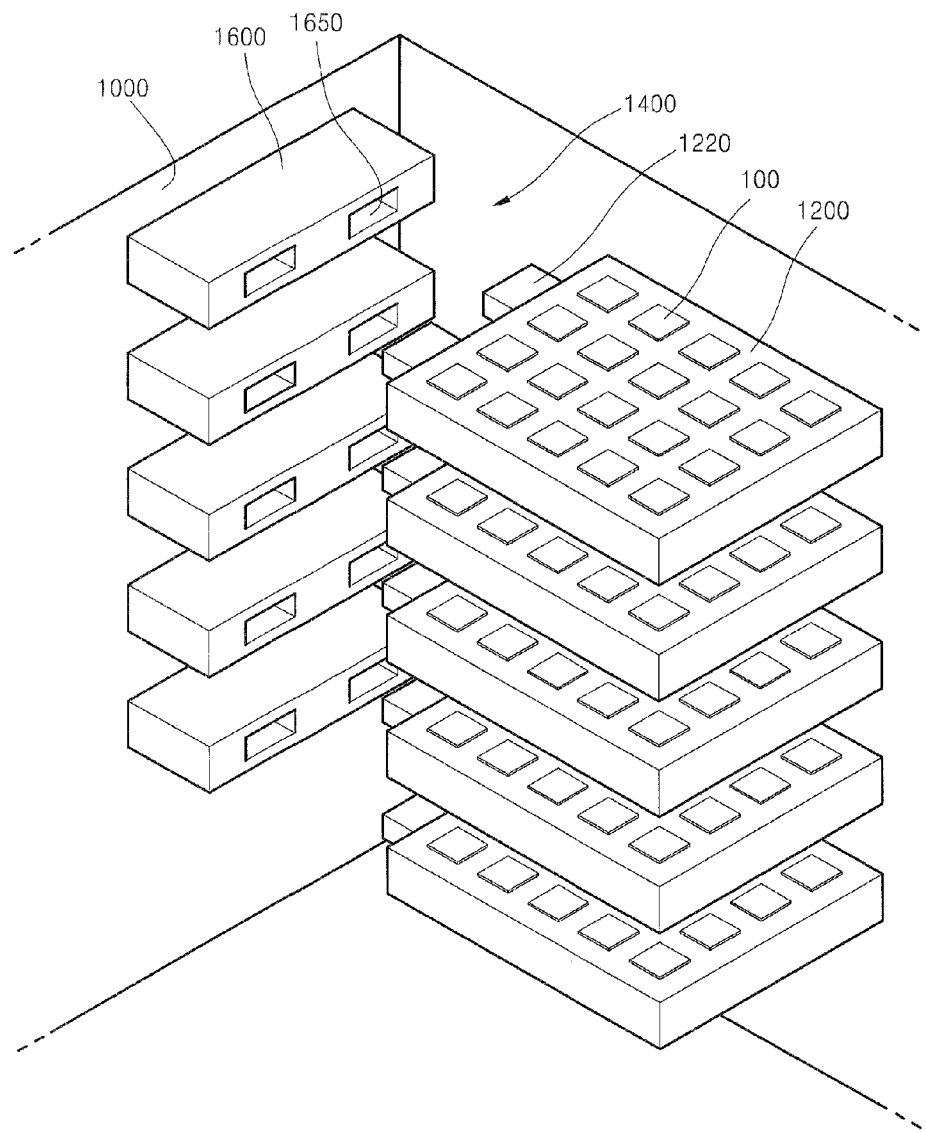
FIG. 7B is a perspective view illustrating in more detail a structure of the chamber illustrated in FIG. 7A.

FIG. 7B is a perspective view illustrating in more detail a structure of the chamber 1000 illustrated in FIG. 7A.

Referring to FIG. 7B, in the test room 1400 are disposed a plurality of test contact portions 1600 in each of which input/output terminals 1650 are formed. The input/output terminals 1220 of the burn-in boards 1200 and the input/output terminals 1650 of the test contact portions 1600 are physically and electrically connected, such that test software delivered from the test device 1500 is loaded into the plurality of semiconductor apparatuses 100 on the burn-in boards 1200.

Figure 8:
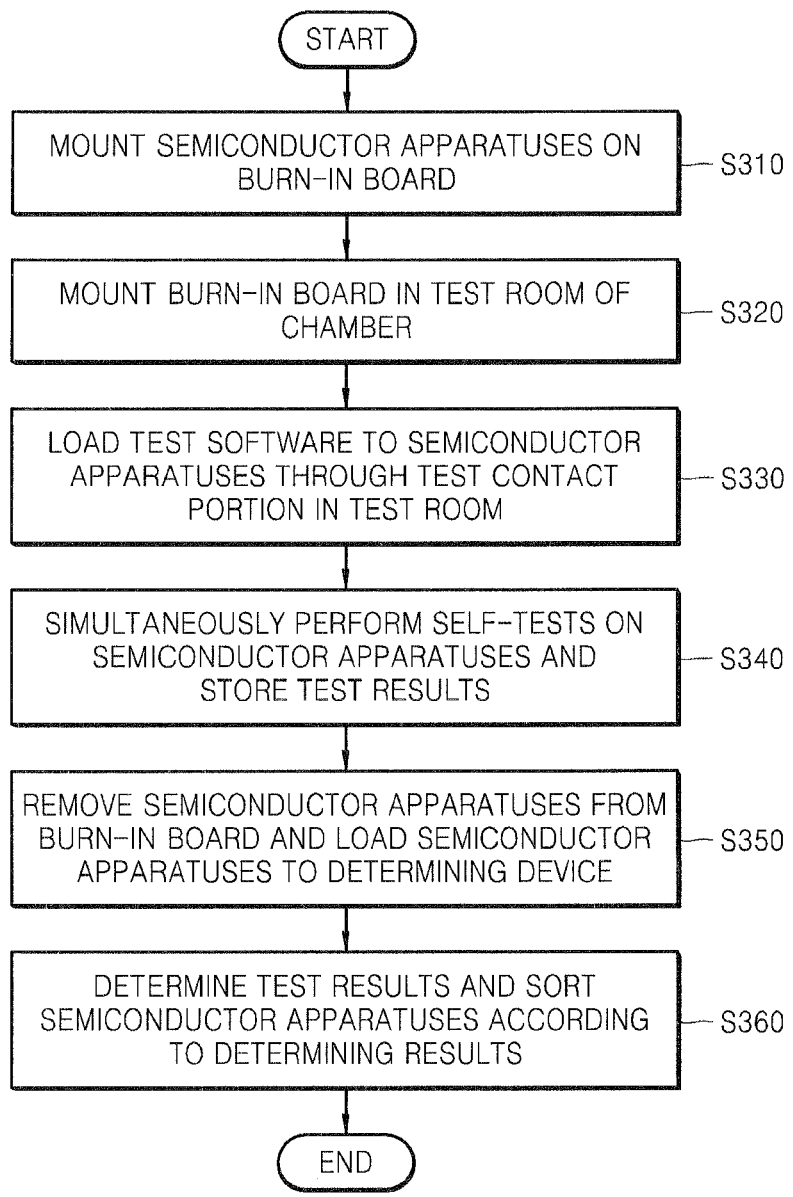
FIG. 8 is a flowchart illustrating a process of testing a plurality of semiconductor apparatuses simultaneously and continuously by using the test equipment illustrated in FIGS. 7A and 7B, according to an exemplary embodiment of the inventive concept.

FIG. 8 is a flowchart illustrating a process of testing the plurality of semiconductor apparatuses 100 simultaneously and continuously by using the test equipment illustrated in FIGS. 7A and 7B, according to an exemplary embodiment of the inventive concept. To facilitate understanding, reference will be made also to FIGS. 7A and 7B.

Referring to FIG. 8, the plurality of semiconductor apparatuses 100 are mounted on the burn-in board 1200 in operation 5310. In operation S320, the burn-in board 1200 is mounted in the test room 1400 of the chamber 1000. Herein, the mounting of the burn-in board 1200 may mean that the input/output terminals 1220 of the burn-in board 1200 are physically coupled to the input/output terminals 1650 of the test contact portion 1600.

The test software is loaded to the semiconductor apparatuses 100 through the test contact portion 1600 in operation S330. Herein, test software loading may be performed as the burn-in board 1200 is sequentially connected to the test contact portion 1600 of the test room 1400, or may be performed sequentially through switches after all the burn-in boards 1200 to be tested are connected to the test contact portions 1600, respectively.

After completion of test software loading, the plurality of semiconductor apparatuses 100 in the burn-in board 1200 perform self-tests at the same time and the test results are stored in memories of the semiconductor apparatuses 100, respectively, in operation 5340. Independent of the self-tests, test software loading takes place on the next burn-in board 1200 in a sequential manner.

Once the semiconductor apparatuses 100 in the burn-in board 1200 finish the self-tests, they are removed from the burn-in board 1200 and then are loaded to the determining device 1700 in operation 5350. The determining device 1700 determines "pass" or "fail" for the respective semiconductor apparatuses 100 based on the test results stored in the memories of the semiconductor apparatuses 100, and the sorting-storing unit 1900 sorts and stores the semiconductor apparatuses 100 based on the determination results in operation 5360.

Figure 9:
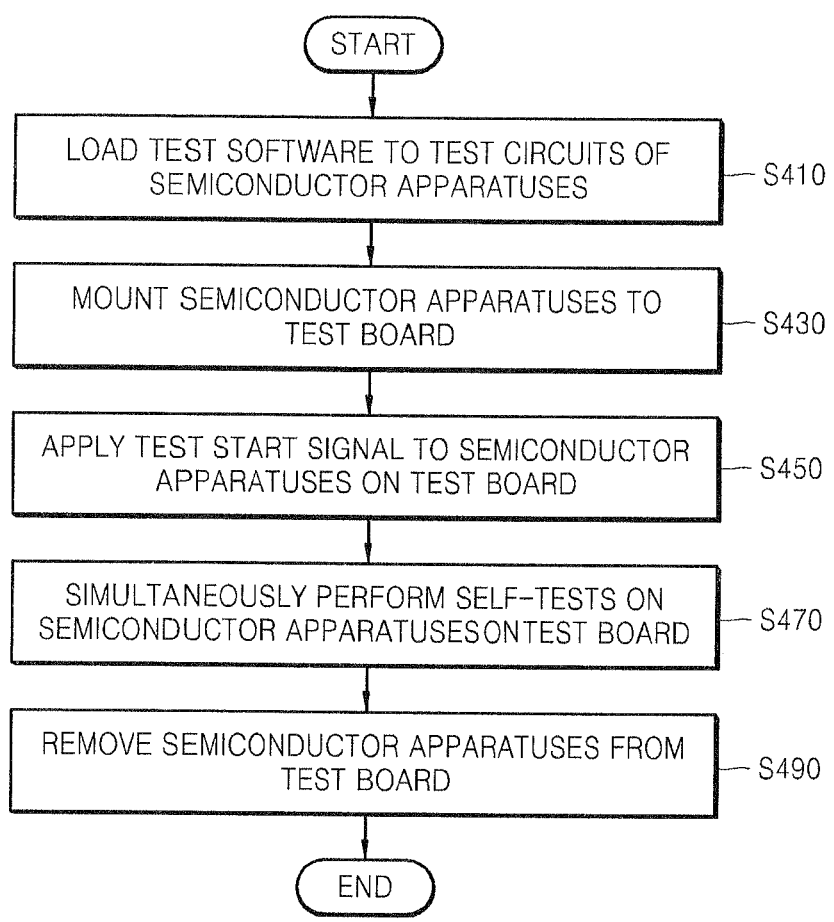
FIG. 9 is a flowchart illustrating a method of testing a plurality of semiconductor apparatuses simultaneously and continuously according to an exemplary embodiment of the inventive concept.

FIG. 9 is a flowchart illustrating a method of testing a plurality of semiconductor apparatuses simultaneously and continuously according to an exemplary embodiment of the inventive concept.

Referring to FIG. 9, the test method according to the current embodiment loads test software to a test circuit of each semiconductor apparatus in operation 5410. Herein, test software loading may be different from that described so far. In other words, in the previous embodiments, test software is loaded to a test circuit of each semiconductor apparatus from a test device on a real time basis. In the current embodiment, however, test software loading may mean pre-storing the test software in a storage device such as a memory.

Next, the plurality of semiconductor apparatuses having pre-stored the test software are mounted on a test board in operation 5430. A test start signal is applied to the plurality of semiconductor apparatuses on the test board in operation 5450. Upon application of the test start signal, the test software in the memories of the semiconductor apparatuses is loaded into test circuits of the semiconductor apparatuses, and self-tests are conducted by the test circuits in operation 5470. The test start signal may be sequentially or simultaneously applied to a plurality of test boards. From start of the test until completion of the test, power may be continuously supplied to the plurality of semiconductor apparatuses on each test board.

Once the self-tests of the semiconductor apparatuses are completed, the plurality of semiconductor apparatuses are removed from the test board in operation 5490.

The test method according to the current embodiment is different from the test method according to the previous embodiments in that, in the current embodiment, the test software is pre-stored and then loaded by the semiconductor apparatus itself, whereas, in the prior embodiments, the test software is loaded in real time, by a test device, at the time of the test. Nevertheless, the current embodiment still effectuates self-tests that are independent of test software loading on another test board.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A method of testing a plurality of semiconductor apparatuses, the method comprising:
    mounting a plurality of semiconductor apparatuses on a first test board, wherein the plurality of semiconductor apparatuses include test circuits;
    loading test software into the test circuits;
    performing, by using the test circuits, self-tests on the plurality of semiconductor apparatuses based on the test software;
    removing the plurality of semiconductor apparatuses, which have completed the self-tests, from the first test board; and
    continuously supplying power from a start of the self-tests on the plurality of semiconductor apparatuses on the first test board until completion of the self-tests on a plurality of semiconductor apparatuses on a last test board,
    wherein upon completion of the loading of the test software, the test software is loaded into test circuits of a plurality of semiconductor apparatuses on a second test board by disconnecting the first test board from a test signal line and connecting the second test board to the test signal line, while the self-tests are performed on the plurality of semiconductor apparatuses on the first test board, and a time of the self-tests on the plurality of semiconductor apparatuses on the first test board is overlapped with at least a portion of a time of self-tests on the plurality of semiconductor apparatuses on the second test board.

2. The method of claim 1, wherein the test circuits are controllers provided in the plurality of semiconductor apparatuses on the first or second test boards.

3. The method of claim 2, wherein the test software is embedded in Firm Ware (F/W) of the controllers, and in the performing of the self-tests, the controllers test the plurality of semiconductor apparatuses based on the test software.

4. The method of claim 1, wherein the test circuits are Built-In Self Test (BIST) circuits provided in the plurality of semiconductor apparatuses on the first or second test boards.

5. The method of claim 4, wherein the test software is loaded into the BIST circuits, and in the performing of the self-tests, the BIST circuits test the plurality of semiconductor apparatuses based on the test software.

6. The method of claim 1, wherein the plurality of semiconductor apparatuses on the first or second test boards comprise memories, and in the performing of the self-tests, the test circuits test the memories.

7. The method of claim 6, wherein the test circuits store test results of the memories in the memories.

8. The method of claim 7, wherein if the test results are not stored in a memory, or if the memory cannot be read, the semiconductor apparatus including the memory has failed its self-test.

9. The method of claim 1, wherein a time for loading the test software to the test circuits of the plurality of semiconductor apparatuses on the first test hoard is shorter than a time for performing the self-tests on the plurality of semiconductor apparatuses on the first test board.

10. The method of claim 1, wherein a total time for the method not including the mounting and removing steps is equal to a time for performing the self-tests on the plurality of semiconductor apparatuses on the first test board+a time for loading the test software into the test circuits of the plurality of semiconductor apparatuses on the first test board×a number of test boards.

11. The method of claim 1, wherein the method uses test equipment comprising a handler and when the test equipment comprising the handler is used,
    the first and second test boards are first and second test trays, respectively, provided in the handler, and
    the handler comprises first and second test contact portions corresponding to the first and second test trays, such that the first and second test contact portions sequentially load the test software to the plurality of semiconductor apparatuses on the first and second test trays through first and second switches, respectively, or
    the handler comprises a single test contact portion, such that when the first and second test trays are sequentially connected to the single test contact portion, the single test contact portion loads the test software into the plurality of semiconductor apparatuses on the test tray connected thereto.

12. The method of claim 1, wherein the method uses test equipment comprising a chamber and when the test equipment comprising the chamber is used,
    the first and second test boards are first and second burn-in boards, respectively, and
    when the first and second burn-in boards are being sequentially mounted in a test room of the chamber, the test software is loaded to the first burn-in board through a first contact portion of the chamber, and then, to the second burn-in board through a second contact portion of the chamber, or
    after the first and second burn-in boards are mounted in the test room of the chamber, the test software is sequentially loaded through the first and second contact portions, respectively, of the chamber.

13. A method of testing a plurality of semiconductor apparatuses, the method comprising:
    mounting a plurality of semiconductor apparatuses on a first test board of test equipment, wherein the plurality of semiconductor apparatuses include test circuits;
    loading test software to the test circuits;
    performing, by using the test circuits, self-tests on the plurality of semiconductor apparatuses based on the test software, wherein a test contact portion of the test equipment loads the test software into the test circuits of the plurality of semiconductor apparatuses on the first test board, and upon completion of the loading of the test software to the first test board, loads the test software into test circuits of a plurality of semiconductor apparatuses on a second test board by disconnecting the first test board from a test signal line and connecting the second test board to the test signal line, while the self-tests are performed on the plurality of semiconductor apparatuses on the first test board, and a time of the self-tests on the plurality of semiconductor apparatuses on the first test board is overlapped with at least a portion of a time of self-tests on the plurality of semiconductor apparatuses on the second test board; and continuously supping power from a start of the self-tests on the plurality of semiconductor apparatuses on the first test board until completion of the self-tests on a plurality of semiconductor apparatuses on a last test board.

14. The method of claim 13, wherein the test equipment comprises:
- a handler or a burn-in chamber, the handler comprising a test tray, wherein the test tray is the first or second test board, and a test contact portion which loads the test software to the test circuits of the plurality of semiconductor apparatuses on the test tray, and the burn-in chamber comprising first and second burn-in hoards, wherein the first and second burn-in boards are the first and second test hoards, respectively, and a test room in which the first and second burn-in boards are disposed;
- a test device providing the test software to the handler or the burn-in chamber;
- a determining device reading results of the self-tests stored in memories of the plurality of semiconductor apparatuses on the first or second test boards to determine whether the plurality of semiconductor apparatuses passed or failed their respective self-tests; and
- a sorting-storing unit sorting and storing the plurality of semiconductor apparatuses according to the pass or fail determination of the determining device.

15. A method, comprising:
- loading first test software into a plurality of semiconductor apparatuses disposed on a first test hoard;
- loading, upon completion of the loading of the first test software on the first test hoard, second test software into a plurality of semiconductor apparatuses disposed on a second test board by disconnecting the first test board from a test signal line and connecting the second test board to the test signal line, while the plurality of semiconductor apparatuses on the first test hoard are undergoing tests based on the first test software, and a time of the tests on the plurality of semiconductor apparatuses on the first test board is overlapped with at least a portion of a time of tests on the plurality of semiconductor apparatuses on the second test board; and
- continuously supplying power from a start of the tests on the plurality of semiconductor apparatuses on the first test board until completion of the tests on a plurality of semiconductor apparatuses on a last test board.

16. The method of claim 15, wherein the plurality of semiconductor apparatuses on the first test board are tested at the same time.

17. The method of claim 15, wherein the first and second test software are the same.

18. The method of claim 15, wherein the first and second test software are different.

* * * * *